United States Patent [19]

Gilton et al.

[11] Patent Number: 5,151,168

[45] Date of Patent: Sep. 29, 1992

[54] PROCESS FOR METALLIZING INTEGRATED CIRCUITS WITH ELECTROLYTICALLY-DEPOSITED COPPER

[75] Inventors: Terry L. Gilton; Mark E. Tuttle; David A Cathey, all of Boise, Id.

[73] Assignee: Micron Technology, Inc., Boise, Id.

[21] Appl. No.: 587,302

[22] Filed: Sep. 24, 1990

[51] Int. Cl.[5] ............................................... C25D 5/02
[52] U.S. Cl. .................................... 205/123; 205/135
[58] Field of Search .................................. 204/15, 52.1

[56] References Cited

U.S. PATENT DOCUMENTS 4,624,749 11/1986 Black et al. ........................... 204/15
4,687,552 8/1987 Early et al. ........................... 204/15

OTHER PUBLICATIONS

K. Haberle et al. "Multilevel Gold Metallization" Jun. 13-14, 1988, pp. 117-124.

Primary Examiner—T. M. Tufariello
Attorney, Agent, or Firm—Angus C. Fox, III

[57] ABSTRACT

A masked, conformal electrodeposition process for copper metallization of integrated circuits. The process is considerably less complex than other metallization processes utilizing electrodeposition, and provides excellent step coverage for sub-micron contact openings. Full-step coverage has been obtained with the process for contact openings as small as 0.5 microns in diameter. The process begins with the blanket sputter or LPCVD deposition of a thin conductive barrier layer of a material such as titanium nitride, titanium-tungsten or nitrided titanium-tungsten. A photoresist reverse image of the maskwork that normally would be used to etch the metallization pattern on the circuitry is created on the wafer on top of the barrier layer. As an option, the reverse image of the desired metallization pattern may be created by etching a dielectric material layer such as silicon dioxide or silicon nitride, using a photoresist reverse image as a template. The wafer is then transferred to an electrolytic bath, preferably with a pH of 13.5, in which copper is complexed with EDTA molecules. Metallic copper is deposited on the barrier layer where it is not covered by photoresist. At current densities of less than 1 milliamp/cm$^2$, the process will automatically fill contact/via openings to a uniform thickness which is independent of the depth of the opening. Following electrodeposition of the metallization layer to the desired thickness, the wafer is removed from the bath, and the photoresist or dielectric material reverse-pattern mask is stripped. At this point, an optional corrosion-resistant metal layer may be galvanically plated on the surface of the copper layer. Finally, portions of the barrier layer that were exposed by removal of the resist are then removed with either a wet or a dry etch.

25 Claims, 6 Drawing Sheets

PROCESS FOR METALLIZING INTEGRATED CIRCUITS WITH ELECTROLYTICALLY-DEPOSITED COPPER

FIELD OF THE INVENTION

This invention relates to semiconductor fabrication technology and, more specifically, to electrodeposition processes for filling contact openings and vias and creating interconnect lines with metal.

BACKGROUND OF THE INVENTION

The ideal interconnect material for semiconductor circuitry will be inexpensive, easily patterned, have low resistivity, and high resistance to corrosion, electromigration, and "cold creep". Cold creep is a phenomena that results when a metal layer is deposited, at high temperature, on the surface of another material which has a smaller coefficient of expansion. When both materials are cooled, breaks may occur in the metal layer as the metal layer seeks to satisfy its own coefficient of expansion parameters. Such breaks may render a circuit non-conductive and, hence, useless.

Aluminum is most often used for interconnects in contemporary semiconductor fabrication processes primarily because it is inexpensive and relatively easy to etch. Because aluminum has poor electromigration characteristics and high susceptibility to cold creep, it is necessary to alloy aluminum with other metals.

As semiconductor device geometries shrink and clock speeds increase, it becomes increasingly desireable to reduce the resistance of the circuit metallization. The one criterium that is most seriously compromised by the use of aluminum for interconnects is that of conductivity. This is because the three metals with the lower resistivities—silver with a resistivity of 1.59 ohms/cm, copper with a resistivity of 1.73 ohms/cm, and gold with a resistivity of 2.44 ohms/cm—fall short in other important criteria. Silver, for example, is relatively expensive and corrodes easily, and gold is very costly and difficult to etch. Copper, with a resistivity nearly on par with silver, immunity from electromigration, high ductility (which provides high immunity to mechanical stresses generated by differential expansion rates of dissimilar materials in a semiconductor chip), high melting point (1083° C. vs. 661° C. for aluminum), fills most criteria admirably. However, copper is exceedingly difficult to etch in a semiconductor environment.

Contemporary aluminum metalization processes typically involve the blanket deposition of an aluminum metal layer, using either a sputtering operation or a low-pressure chemical vapor deposition (LPCVD) operation, followed by the etching of the metal layer to create the desired interconnect patterns for the circuitry. However, as semiconductor device dimensions have shrunk, it has become increasingly difficult to obtain adequate metalization step coverage within contact/via openings using sputtering deposition techniques. Although LPCVD provides much better step coverage than sputtering deposition for sub-micron devices, it suffers from several serious drawbacks, including inability to deposit aluminum that is doped with copper or other metals required for resistance to electromigration, cold creep, and silicon crystal formation in metal-to-silicon contact regions. In addition, metal deposition using either sputtering and LPCVD requires relatively high temperatures which promote impurity contamination and diffusion, in addition to creating coefficient of expansion incompatibilities between adjacent layers of dissimilar materials. Expansion incompatibilities may result in cold-creep-induced breaks in interconnect lines which may render the circuit useless. Furthermore, the etching of deposited metal layers to create interconnect lines is not an insignificant task. Aluminum and tungsten, for example, are relatively difficult to etch. This is especially true of aluminum alloys that exhibit minimal grain-boundary diffusion in the presence of an electric current (a necessary characteristic for resistance to electromigration). A defective metal layer etch may result in both shorted or open circuits. Sputter-deposition and LPCVD metalization methods are also adversely affected by particle contamination, which increases the probability of open circuits in the metal interconnect lines.

Given the problems associated with sputter and LPCVD metallizations, a number of electrodeposition processes have been developed for the metallization of semiconductor circuits. Most of these processes utilize gold as the principal metallization material, due to its ease of deposition and resistance to corrosion. However, since the conductivity of gold is little better than that of aluminum, gold metallization of semiconductor circuits is hardly the ideal solution. A typical gold circuit metallization process involves the steps of forming contact openings through a dielectric layer to expose an underlying metal layer or a conductively-doped silicon junction, sputter deposition of a barrier layer of a material such as titanium nitride or titanium-tungsten in combination with a superjacent palladium layer, creating a photoresist mask that exposes those areas of the circuit where metallization is desired (i.e. the regions that will become interconnect lines which, of course, incorporate the contact openings), electroplating a gold layer on top of the barrier layer, electroplating a thin rhodium layer on top of the gold layer, removing the photoresist mask, etching away the barrier layer and, finally, annealing the metallization pattern. A similar process even requires a sputter deposition of a thin gold layer prior to the electrodeposition of the majority of gold. Both processes are quite complex, and requires costly, rare metals.

At first glance, copper would appear to be an ideal metallization material for use in electrodeposition processes. However, electrodeposition processes for semiconductor circuitry utilizing copper as the principal metallization material have not been used, due to the difficulty of depositing copper metal on a barrier layer. Because copper, like most other metals, tends to diffuse into silicon junctions, altering the electrical characteristics thereof, the use of a barrier material such as titanium nitride, titanium-tungsten, or nitrided titanium-tungsten is essential.

Although there are a number of "textbook" copper electrodeposition baths, all are simply unusable in the context of semiconductor metallization in combination with conventional barrier materials. For example, a bath comprised of copper sulfate ($CuSO_4$) and sulfuric acid ($H_2SO_4$) produces poor adhesion of the deposited copper layer to the barrier material due to rapid oxide formation of the barrier material surface. In addition, the deposited copper layer tends to be of non-uniform thickness. When a bath comprised of copper pyrophosphate ($Cu_2P_2O_7$), potassium pyrophosphate ($K_2H_2P_2O_7$), ammonium hydroxide ($NH_4OH$) and ammonium nitrate (NH$_4$NO$_3$) is used, metallic copper will not adhere to the barrier layer. The powdered copper that is deposited washes off with water. The moderately-hazardous bath comprised of copper fluoborate (Cu[BF$_4$]$_2$), fluoboric acid (HBF$_4$), and boric acid (HBO$_3$) also produces only copper powder. The ultrahazardous bath comprised of copper cyanide (Cu[CN]$_2$), sodium cyanide (NaCN), and sodium hydroxide (NaOH) will produce an adherent copper metal layer on titanium-tungsten (though not on titanium nitride). However, this particular electrodeposition process will not satisfactorily fill contact openings. Another bath described in the literature, comprised of tetra-ammonium cuprite (Cu[NH$_3$]$_4$, and ammonium hydroxide (NH$_4$OH), will not deposit copper on the barrier material.

What is needed is a relatively safe, simplified, copper electrodeposition process for the metallization of semiconductor circuitry which demonstrates excellent step coverage and adhesion characteristics.

SUMMARY OF THE INVENTION

This invention consists of a relatively non-hazardous process for metallizing semiconductor circuitry with copper through electrodeposition. The process is considerably less complex than other metallization processes utilizing electrodeposition, and provides excellent step coverage for sub-micron contact openings. Full-step coverage has been obtained with the process for contact openings as small as 0.5 microns in diameter.

The process begins with the blanket depositin of a thin conductive barrier layer of a material such as titanium nitride, titanium-tungsten or nitrided titanium-tungsten on the surface of a wafer that is undergoing integrated circuit fabrication that has proceeded to the stage where contact vias have been opened in the circuitry. The barrier layerfunctions both as a diffusion barrier for a metalization layer that will be electroplated thereupon and as the initial conductive surface for the elecrodeposition process. The barrier layer may be deposited using one of several available techniques, including sputtering or LPCVD, withLPCVD being the preferred method because it produces layers having greater conformality. Optimum barrier layer thickness is deemed to be approximately 200 Å to 300 Å. A photoresist reverse image of the maskwork that normally would be used to etch the metalliation pattern on the circuitry is created on the wafer on top of the barrier layer. As an option, the reverse image of the desired metallization pattern may be created by etching a dielectric material layer such as silicon dioxide or silicon nitride, using a photoresist reverse image as a template. The wafer is then transferred to an electrolytic bath in which copper is complexed with EDTA molecules. Such a bath is normally utilized for galvanic, not electrolytic, deposition. A pH level of 13.5 is preferred, although metallic copper will adhere to the barrier layer and achieve excellent step coverage with a pH range of roughly 6.0 to 13.5. At the lower pH values, the copper metal is much more coarsely grained. Sodium hydroxide or potassium hydroxide is utilized to adjust the pH level. Metallic copper is deposited on the barrier layer where it is not covered by photoresist. At current densities of less than 1 milliamp/cm$^2$, the process will automatically fill contact/via openings to a uniform thickness which is independent of the depth of the opening. Following electrodeposition of the metallization layer to the desired thickness, the wafer is removed from the bath and the photoresist or dielectric material reverse-pattern mask is stripped. At this point, a layer of corrosion-resistant metal such as gold, nickel or palladium may be galvanically plated on the copper metallization layer. Finally, portions of the barrier layer that have been exposed by removal of the resist are then removed with either a wet or a dry etch with little or no undercutting.

PREFERRED EMBODIMENT OF THE INVENTION

Figure 1:
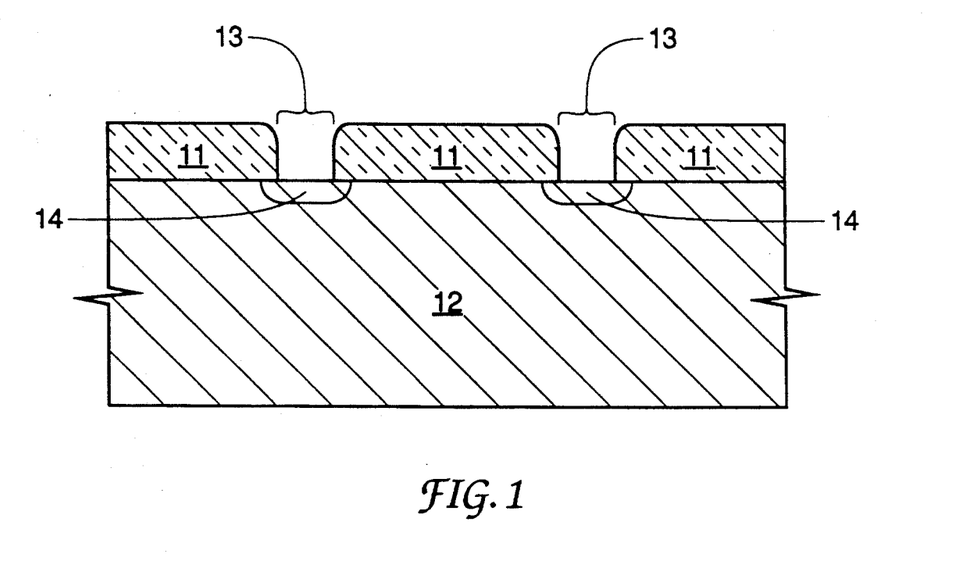
FIG. 1 is a cross-sectional view of a portion of an in-process semiconductor wafer at the stage where a dielectric layer has been patterned and etched in order to create contact openings through the dielectric layer to junction regions within the substrate below.

Referring now to FIG. 1, a portion of a semiconductor wafer containing in-process integrated circuit chips is shown at the stage where a dielectric layer 11 overlying a silicon substrate 12 has been patterned and etched in order to create contact openings 13 through dielectric layer 11 to junction regions 14 within the substrate 12.

Figure 2:
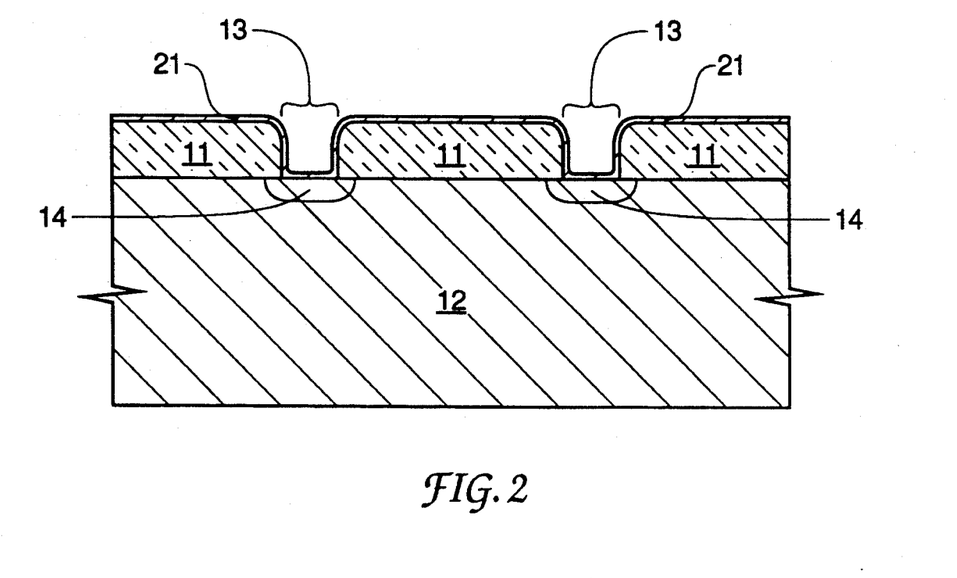
FIG. 2 is a cross-sectional view of the in-process wafer portion of FIG. 1, following the deposition of a barrier layer thereon.

Referring now to FIG. 2, a thin conductive barrier layer 21 of titanium nitride or titanium-tungsten is blanket deposited over the surface of the entire wafer. Barrier layer 21 functions both as a diffusion barrier to prevent spiking (contamination) of junctions 14 by a metalization layer that will be electroplated on top of barrier layer 21, and as the initial conductive surface for the electrodeposition process. Barrier layer 21 may be deposited using one of several available techniques, including sputtering or LPCVD, with LPCVD being the preferred method because it produces layers having greater conformality. Optimum barrier layer thickness is deemed to be approximately 200Å to 300Å.

Figure 3:
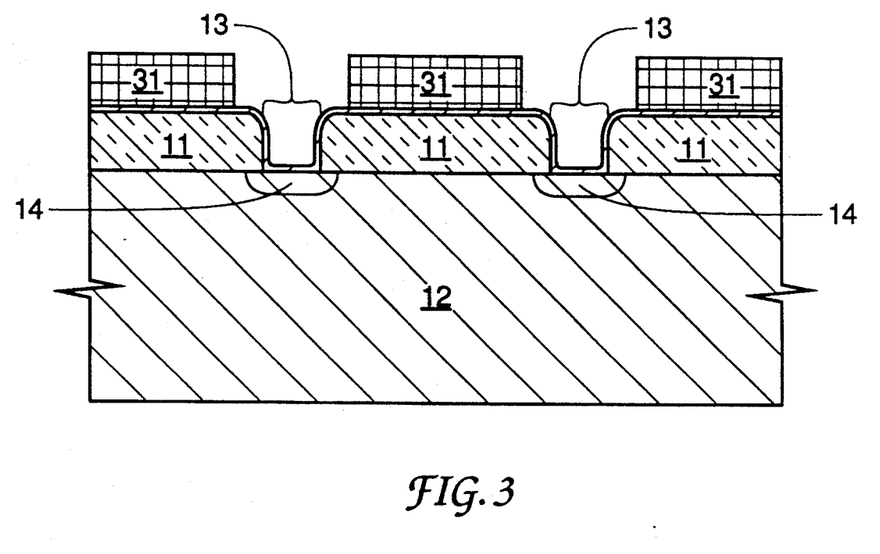
FIG. 3 is a cross-sectional view of the in-process wafer portion of FIG. 2, following the creation of a dielectric material mask thereon, said mask having the reverse image of the desired interconnect pattern.

Referring now to FIG. 3, is a cross-sectional view of the in-process wafer portion of FIG. 2, following the creation of a dielectric material mask 31 on top of barrier layer 21, said mask having the reverse image of the desired interconnect pattern. Dielectric material mask 31 may be created either out of photoresist directly or by etching a layer of a material such as silicon dioxide or silicon nitride, using photoresist as a template. If photoresist is utilized for the mask, for optimum copper electrodeposition performance, it must be toughened by subjecting it to ultraviolet radiation during a high-temperature post-baking operation.

Figure 4:
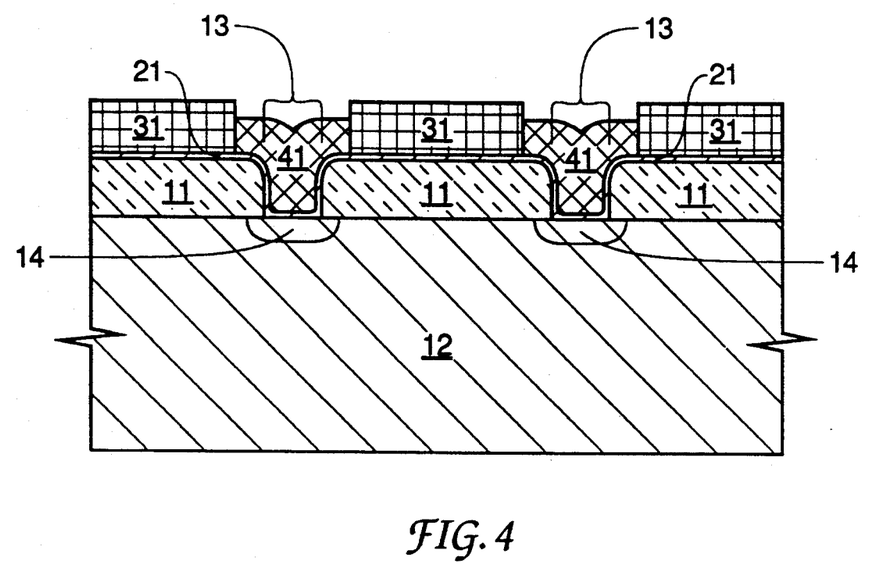
FIG. 4 is a cross-sectional view of the in-process wafer portion of FIG. 3, following the conformal electrodeposition of copper on exposed portions of the barrier layer.

Referring now to FIG. 4, the wafer is then transferred to an electrolytic bath, maintained at a constant temperature of approximately 25° C., in which copper is complexed with ethylene diamine tetraacetic acid (EDTA) molecules in a basic solution. Such a bath is normally utilized for galvanic, not electrolytic, deposition. Copper sulfate ($CuSO_4$) in a concentration of 0.035 molar provides the copper ions for the reaction (a useful range is deemed to be between 0.01 and 0.07 molar). Additionally, a $Na_4EDTA$ concentration of 0.070 molar is used (a useful range is deemed to be between 0.02 and 0.14 molar). A pH level of 13.5 is preferred, although metallic copper will adhere to the barrier layer and achieve excellent step coverage with a pH range of roughly 6.0 to 13.5. For pH values above 10, photoresist dielectric material masks must be stabilized with UV radiation during a post-baking step. At the lower pH values, though, the copper metal is much more coarsely grained. Sodium hydroxide or potassium hydroxide is utilized to adjust the pH level. Metallic copper 41 is deposited on those portions of barrier layer 21 where it is not covered by dielectric material mask 31. At current densities of less than 1 milliamp/$cm^2$, the process will automatically fill contact/via openings to a uniform thickness which is independent of the depth of contact/via openings 13.

Figure 5:
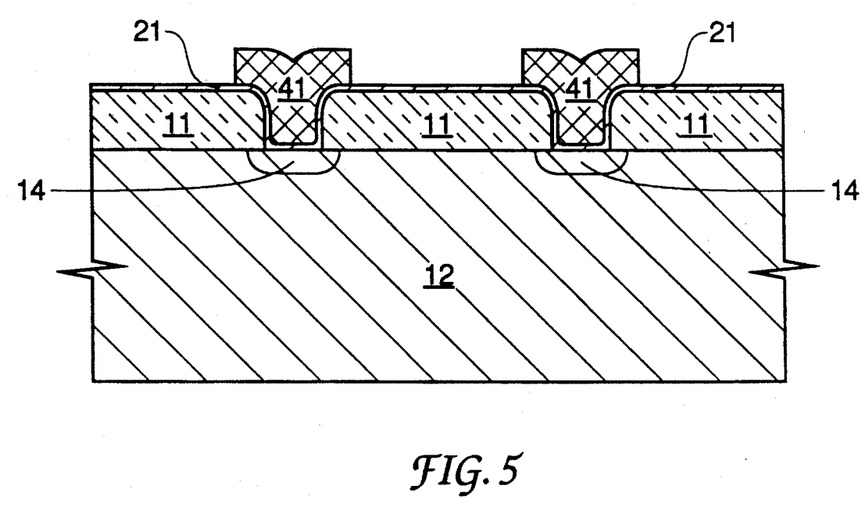
FIG. 5 is a cross-sectional view of the in-process wafer portion of FIG. 4, following the stripping of the dielectric material mask.

Referring now to FIG. 5, following electrodeposition of the copper metallization layer to the desired thickness, the wafer is removed from the electroplating bath, rinsed, dried, and dielectric material mask 31 is stripped. If a post-baked and UV-irradiated toughened photoresist dielectric material mask was employed to prevent dissolution of the mask in solutions of high pH values, the non-aqueous photoresist stripping compound covered by U.S. Pat. No. 4,617,251 entitled "Stripping Composition and Method of Using the Same" will remove the resist without removing the deposited copper (a problem with dry ash removal of photoresist). The non-aqueous photoresist stripping compound is essentially free of phenol compounds and halogenated hydrocarbon compound and consists essentially of: from about 2 percent to about 98 percent by weight of an amine compound selected from the group consisting of compounds having the formula $(H_2)_N$—$(H_2C)_N$—Y—$(H_2C)_M$—Z, wherein N and M are each independently an integer ranging from 1-5 inclusive; Y is either —O— or —NH—; and Z is —H, —OH or —$NH_2$; and mixtures thereof, and; from about 98 to about 2 percent by weight of an organic polar solvent selected from the group consisting of N-methyl-2-pyrrolidinone, tetrahydrofurfuryl alcohol, isophorone, dimethyl sulfoxide, dimethyl adipate, dimethyl glutarate, sulfolane, gamma -butyrolactone, N,N-dimethylacetamide and mixtures thereof.

Figure 6:
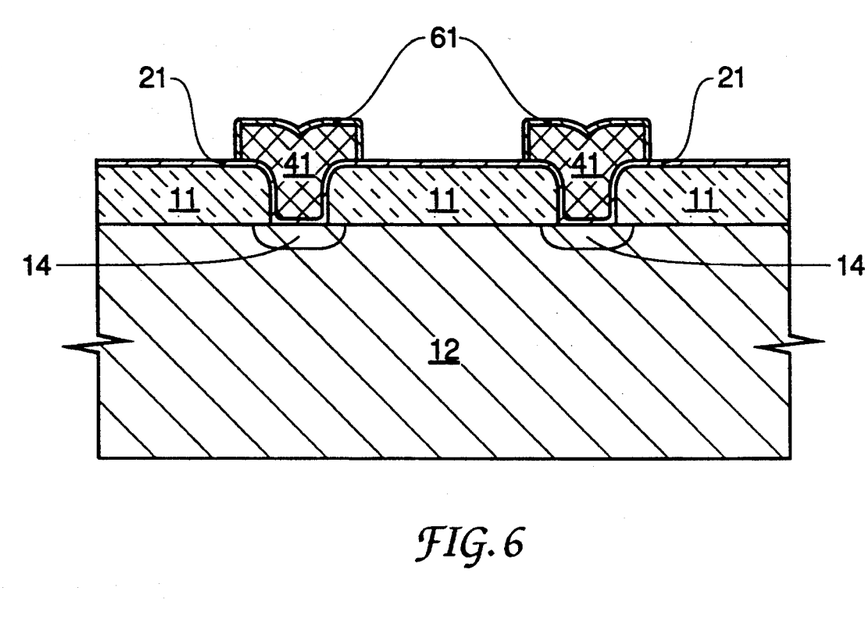
FIG. 6 is a cross-sectional view of the in-process wafer portion of FIG. 5, following the galvanic deposition of a corrosion-inhibiting metal layer on the exposed surfaces of the deposited copper layer.

Referring now to FIG. 6, an optional galvanic deposition of a corrosion-resistant metal layer 61 on the horizontal surfaces and vertical edges of the deposited copper interconnects may now be performed, using the appropriate conventional galvanic plating solution. For example, gold may be galvanically plated in a bath having a pH of 13.3, held at a constant temperature of 70° C., and comprised of $KAu[CN]_2$ at a concentration of 1.44 g/l, KCN at a concentration of 6.5 g/l, NaOH at a concentration of 8.0 g/l, and $KBH_4$ at a concentration of 10.8 g/l. Since a titanium nitride barrier layer will not catalyze these galvanic reactions, deposition of the corrosion-resistant metal occurs only on exposed copper. Reactions for the galvanic deposition of nickel, palladium and other metals on copper are also known in the art.

Figure 7:
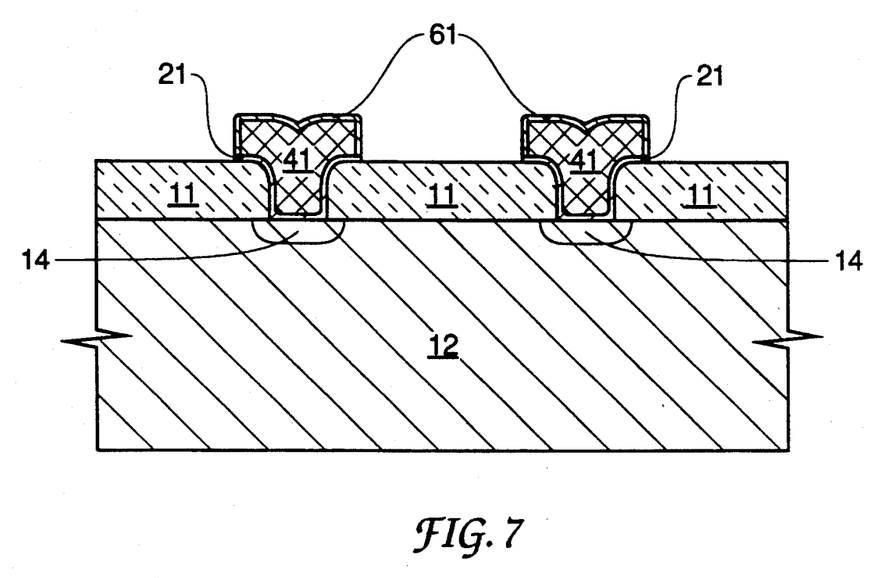
FIG. 7 is a cross-sectional view of the in-process wafer portion of FIG. 6, following the removal of exposed portions of the barrier layer with a wet or dry etch.

Referring now to FIG. 7, the barrier layer has been removed with either a dry or wet etch with little or no undercutting of the deposited copper layer or (if the optional anti-corrosive galvanic plating step is used) the corrosion-resistant metal layer 61.

Figure 8:
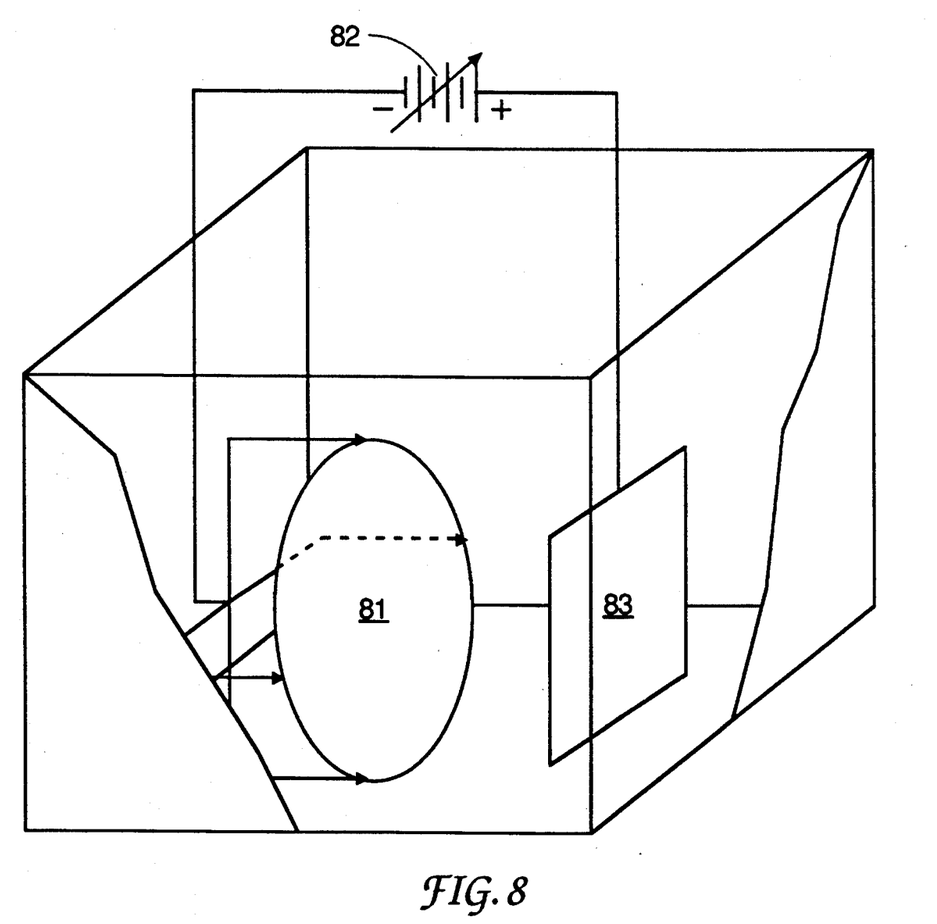
FIG. 8 is a diagrammatic representation of the plating bath utilized for the process.

Referring now to FIG. 8, a workable arrangement for the connection of a wafer 81 to a DC voltage source 82 is shown. The wafer 81, which functions as the cathode in the electroplating reaction, and an appropriate anode 83 are submersed in the EDTA-complexed copper plating solution described above in reference to FIG. 4.

Figure 9:
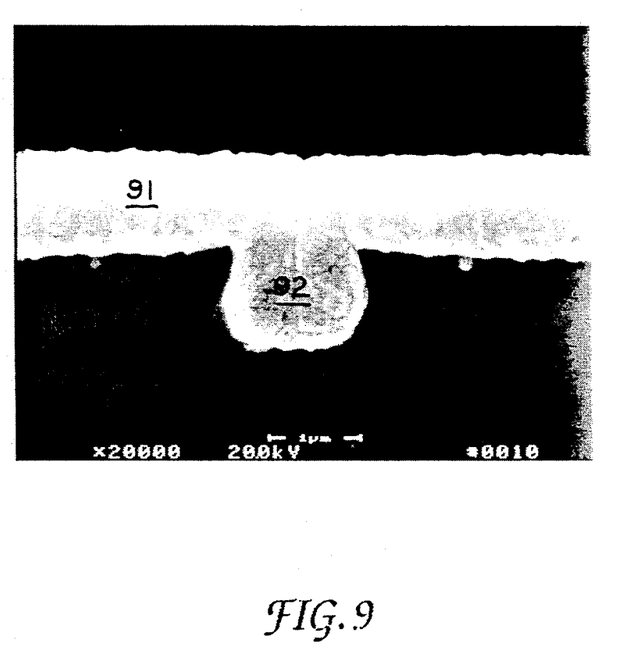
FIG. 9 is a scanning electromicrograph of a contact opening filled with the new copper metallization process.

FIG. 9 is a scanning electron micrograph of a copper interconnect line 91 and integral copper contact opening fill 92 that was created using the new metallization process. It will be noted that conformality of the deposited copper layer is excellent.

Although only several embodiments of the electrodeposition process for simultaneously filling contact/via openings and creating interconnects on integrated circuitry with copper is disclosed, it will be apparent to those having ordinary skill in the art, that changes may be made thereto without departing from the spirit and the scope of the process as claimed. For example, as an alternative to photoresist masking of the wafer with the metallization pattern during the electrodeposition step, the metallization pattern may be etched into the insulative layer, through which the contact/via openings are then etched prior to barrier layer deposition. Channels are thus formed in the insulative layer in interconnect locations. Barrier deposition is followed by the unmasked electrodeposition of a conformal metallization layer which fills contact/via openings and interconnect channels, in addition to conformally blanketing the entire surface of the wafer. Following the electrodeposition step, the wafer is polished to remove metallization layer material that does not fill contact/via openings and interconnect channels.

We claim:

1. A process for metallizing an integrated circuit chip with copper comprising the following sequence of steps:
   forming electrical contact openings in a dielectric layer on the chip;
   deposition of a conductive barrier layer on the surface of the chip;
   creating a dielectric material mask on top of the barrier layer, said mask being a reverse image of the desired metallization pattern;
   submersing the chip in an electrolytic bath having copper ions complexed with EDTA molecules, such that metallic copper is deposited to a desired thickness on portions of the barrier layer that are not covered by said dielectric material mask;
   stripping the dielectric material mask; and
   removal of those portions of the barrier layer that were exposed by removal of the dielectric material mask.

2. The process for metallizing of claim 1, wherein said electrolytic bath is a basic solution having a pH within a range of 6.5 to 14.0.

3. The process for metallizing of claim 2, wherein said electrolytic bath is a basic solution having a pH within a range of 13.0 to 14.0.

4. The process for metallizing of claim 1, wherein said electrolytic bath is maintained at a temperature within a range of 20° C. to 35° C.

5. The process for metallizing of claim 4, wherein said electrolytic bath is maintained at a temperature substantially equal to 25° C.

6. The process for metallizing of claim 1, wherein current densities within the chip are maintained below 1.0 milliamp/cm$^2$.

7. The process of claim 1, wherein said barrier layer consists of titanium nitride.

8. The process of claim 1, wherein said barrier layer consists of titanium-tungsten.

9. The process of claim 1, wherein said barrier layer consists of nitrided titanium-tungsten.

10. The process of claim 1, wherein said dielectric material mask consists of photoresist.

11. The process of claim 10, wherein said photoresist is UV irradiated and baked to stabilize it so that it will not dissolve in a highly-basic electrolytic bath.

12. The process of claim 11, wherein stripping of the photoresist dielectric material mask is accomplished with a non-aqueous photoresist stripping compound which is essentially free of phenol compounds and halogenated hydrocarbon compounds and which consists essentially of:

a) from about 2 percent to about 98 percent by weight of an amine compound selected from the group consisting of compounds having the formula $(H_2)_N$—$(H_2C)_N$—Y—$(H_2C)_M$—Z, where N and M are each independently an integer ranging from 1-5 inclusive; Y is either —O— or —NH—; and Z is —H, —OH or —NH$_2$; and mixtures thereof, and;

b) from about 98 to about 2 percent by weight of an organic polar solvent selected from the group consisting of N-methyl-2-pyrrolidinone, tetrahydrofurfuryl alcohol, isophorone, dimethyl sulfoxide, dimethyl adipate, dimethyl glutarate, sulfolane, gamma -butyrolactone, N,N-dimethylacetamide and mixtures thereof.

13. The process of claim 1, wherein said dielectric material mask consists of silicon dioxide 14. The process of claim 1, wherein said dielectric material mask consists of silicon nitride.

15. The process of claim 1, which further comprises the step of galvanically depositing an optional corrosion-resistant metal layer on the surface of the deposited copper layer following electrodeposition of copper and prior to stripping the dielectric material layer mask.

16. The process of claim 15, wherein said corrosion-resistant metal is gold.

17. The process of claim 15, wherein said corrosion-resistant metal is nickel.

18. The process of claim 15, wherein said corrosion-resistant metal is palladium.

19. The process of claim 1, wherein the copper ions in said electrolytic bath are provided by copper sulfate.

20. The process of claim 19, wherein said copper sulfate has a concentration within a range of 0.01 to 0.07 molar.

21. The process of claim 20, wherein said copper sulfate has a concentration substantially equal to 0.035 molar.

22. The process of claim 1, wherein the EDTA molecules in said electrolytic bath are provided by a hydrolyzed salt.

23. The process of claim 22, wherein the salt is Na$_4$EDTA.

24. The process of claim 23, wherein the concentration of said salt is within a range of 0.02 to 0.14 molar.

25. The process of claim 24, wherein the concentration of said salt is substantially equal to 0.070 molar.

* * * * *